United States Patent [19]

Joslin et al.

[11] Patent Number: 5,217,832
[45] Date of Patent: Jun. 8, 1993

[54] PERMANENT COLOR TRANSPARENCIES ON SINGLE SUBSTRATES AND METHODS FOR MAKING THE SAME

[75] Inventors: Robert W. Joslin, Burbank; Kathleen L. Nelson, Pasadena, both of Calif.

[73] Assignee: The Walt Disney Company, Burbank, Calif.

[21] Appl. No.: 824,670

[22] Filed: Jan. 23, 1992

[51] Int. Cl.$^5$ .............................................. G03F 7/00
[52] U.S. Cl. .......................................... 430/7; 430/321; 430/15; 430/290; 430/293; 430/323; 430/324; 430/325; 430/329; 359/590
[58] Field of Search ....................... 430/321, 7, 15, 21, 430/290, 293, 323, 324, 364, 394, 325, 329; 427/162, 166; 359/590

[56] References Cited

U.S. PATENT DOCUMENTS

| | | | |
|---|---|---|---|
| 3,413,117 | 11/1968 | Gaynor | 430/13 |
| 3,458,309 | 7/1969 | Gaynor | 430/13 |
| 3,914,464 | 10/1975 | Thomasson et al. | 427/54 |
| 3,962,578 | 6/1976 | Roschen | 250/226 |
| 4,258,126 | 3/1981 | Hiesinger | 430/324 |
| 4,269,915 | 5/1981 | Moraw | 430/11 |
| 4,269,932 | 5/1981 | Moraw et al. | 430/290 |
| 4,395,629 | 7/1983 | Sasano et al. | 250/226 |
| 4,431,695 | 2/1984 | Flatscher | 428/209 |
| 4,522,862 | 6/1985 | Bayes et al. | 428/195 |
| 4,587,198 | 5/1986 | Fisch | 430/201 |
| 4,645,290 | 2/1987 | Walsh | 350/1.7 |
| 4,735,892 | 4/1988 | Orpwood et al. | 430/323 |

OTHER PUBLICATIONS

"Full-color photosensitive glass" by S. Donald Stookey, George H. Beall, and Joseph E. Pierson, Oct. 1978, J. Appl. Phys. vol. 49, No. 10, pp. 5114–5123.
"Nondegrading color transparencies" by Fred J. van Milligen, Steven G. Saxe, Ursula J. Gibson, and H. A. Macleod Applied Optics, vol. 24, No. 4, dated Feb. 1985, pp. 461–463.

Primary Examiner—Charles L. Bowers, Jr.
Assistant Examiner—John A. McPherson
Attorney, Agent, or Firm—Pretty, Schroeder, Brueggemann & Clark

[57] ABSTRACT

Color transparencies having more than one imaged dichroic filter, and an imaged neutral density filter, layered on one side of a single glass substrate, and processes for making the same, are disclosed. In one embodiment, the color transparency is produced by a deposition process including the steps of coating a glass substrate with a photoresist and developing an image thereupon, depositing alternating layers of high and low refractive index dielectrics to form a dichroic layer of a primary subtractive color, stripping the photoresist from the glass, preparing at least one additional imaged dichroic filter on the first, and preparing a neutral density filter on the substrate on the side having the layered dichroic filters. A red antihalation coating may be applied to the lower surface of the glass substrate prior to exposing the photoresist to prevent undesirable exposure of additional portions of the photoresist layer. In an alternative embodiment, an etching process is utilized whereby stop-etch layers are deposited between each layer of the color transparency. The stop-etch layers prevent image distortion and uneven coloring during the etching process such that a high resolution color transparency is produced.

16 Claims, 2 Drawing Sheets

PERMANENT COLOR TRANSPARENCIES ON SINGLE SUBSTRATES AND METHODS FOR MAKING THE SAME

BACKGROUND OF THE INVENTION

The present invention relates to permanent, full color transparencies, each having more than one imaged dichroic filter and an imaged neutral density filter deposited on a single glass substrate, and methods for making the same.

Conventional color transparencies generally fade over time due to the degradation of their photosensitive organic dyes. The degradation of these transparencies is particularly severe when they are used in connection with high intensity projectors which emit visible and ultraviolet radiation that is absorbed by the dyes. Thus, the color balance and intensity of a transparency will eventually change if it is continuously projected for long periods at a time, such as those transparencies which are utilized in amusement park exhibits and the like. However, it is not uncommon for transparencies containing organic dyes to obtain uneven color fading within a short period of time, such as after eight hours of continuous projection under high illumination. Accordingly, these transparencies must be replaced as often as once a week, thereby requiring additional costs and maintenance to operate.

In order to avoid color fading, it is generally known in the prior art that a dichroic filter, made from layers of dielectrics such as metal oxides, can be utilized to generate a single color transparency on a glass substrate instead of using organic dyes. Unlike organic dyes, the dielectrics of the dichroic filter are capable of withstanding the effects of high illumination systems. Color degradation and fading is avoided since the dielectrics reflect rather than absorb visible light and ultraviolet radiation. However, the full color transparencies known in the prior art which use dichroic filters have done so using multiple glass substrates. In other words, the color transparencies having more than one color must be made from multiple glass substrates each having a dichroic filter deposited on its surface. The color images on these dichroic filters are of low resolution and are responsible for the hue of the colors. Thus, an additional fourth glass substrate having a black neutral density filter, created by a single layer of metal, is necessarily used to regulate the brightness of the image and to carry higher resolution details of the image. The multiple layers of dichroic filters plus the neutral density filter, each on separate glass substrates, are adhesively bonded together to produce the overall full color transparency. Examples of such transparencies are disclosed in an article entitled "Nondegrading Color Transparencies," by van Milligen et al., in *Applied Optics*, Vol. 24, No. 4, Feb. 15, 1985.

It has been found, however, that color transparencies having dichroic filters on multiple substrates are not acceptable because of their many disadvantages. First, the use of multiple substrates produces multiple focal planes which cause interference and misalignment of colors. Therefore, the image cannot be properly focused because of the inherent lack of a single focal plane. Also, in this regard, it is difficult to align images by adhesively bonding the multiple substrates on which the images appear within the required tolerances for high resolution. Further, adhesively bonding the substrates also introduces the potential for delamination under heating and cooling cycles associated with high intensity projectors.

In addition, these color transparencies do not provide high resolution color images in each of the three subtractive primary colors, magenta, cyan, and yellow. High resolution color images in each of these primary colors is essential for an overall high resolution color transparency. This cannot be achieved solely through the use of a high resolution neutral density filter as simply described above, and as commonly used in the prior art.

Further, the processes known in the prior art for preparing permanent color transparencies commonly use an etching sequence which is not controlled to protect the substrates or filters. Among other things, this may result in non-uniform coloring which is particularly apparent on the magenta layer.

Accordingly, there has existed a definite need for permanent, full color transparencies which overcome these problems. More particularly, there is a need for a permanent, full color transparency on a single glass substrate which provides a high resolution color image, having a single focal plane, which will not fade when projected for long periods of time by high intensity projectors.

SUMMARY OF THE INVENTION

The present invention provides for permanent, full color transparencies on single glass substrates, and methods for making the same.

The color transparency of the first embodiment of the present invention resides in a glass substrate having at least two layers of imaged dichroic filters of the primary subtractive colors, magenta, cyan, and yellow. A high resolution, imaged neutral density filter is also provided, preferably as the first layer on the glass substrate, or in other words, between the glass substrate and first dichroic filter.

The process for making the imaged dichroic filters of this embodiment of the present invention involves coating the substrate (or the previous filter) with a primary photoresist. The photoresist is then exposed by contacting it with a chrome on glass master, or phototool, which possesses the image to be generated on the transparency. The latent image on the photoresist is then developed thereby masking the substrate with respect to the developed image. The masked substrate is then placed in a vacuum chamber where alternating layers of high and low refractive index dielectrics are vapor deposited to form the dichroic filter layer of the desired primary color. Typically, 10 to 30 layers of the dielectrics are deposited on the substrate to form the dichroic layer. The photoresist is then stripped from the glass substrate. The second dichroic filter is similarly prepared to form a glass substrate having at least two imaged dichroic filters. (Additional dichroic filters, if desired, can be similarly prepared.) The neutral density filter is also prepared in the same manner as the imaged dichroic filters with the primary exception that a single layer of metal is deposited to form the black filter, rather than alternating layers of dielectrics.

In another aspect of the present invention, a silicon coating may be deposited on top of the outer dichroic filter to provide an abrasion resistant color transparency.

In a further aspect of the present invention, a red antihalation coating is applied on the surface of the substrate opposite the photoresist. The red antihalation layer is applied before the first photoresist layer is exposed and developed to prevent second surface reflection which may undesirably expose additional portions of the photoresist.

In another embodiment, an etching process rather than a deposition process (as described above) is used to create another color transparency of the present invention. The color transparency produced by this method has stop-etch layers separating the glass substrate and the neutral density filter, and all subsequent dichroic filters.

In this embodiment, each imaged dichroic filter is made by first coating the substrate (or previous filter) with a transparent stop-etch layer. Layers of high and low refractive index dielectrics are then deposited over the stop-etch layer. A photoresist layer is applied over the dichroic filter, and is then exposed and developed to generate the desired image. A dilute acid solution, or other etching process, is then applied to etch out the image on the dichroic filter. The stop-etch layer will prevent the acid solution from "frosting" the glass substrate, thereby preventing distortion of the image and non-uniform coloring of the dichroic filter. The photoresist layer is then stripped.

At least one more imaged dichroic filter is prepared upon the first imaged dichroic filter. A stop-etch layer, however, must be coated upon the previous imaged dichroic layer before the next dichroic filter is prepared. A neutral density filter must also be provided and is prepared by the same, or similar, etching process used for the dichroic filters (with the primary exception that one layer of metal is used rather than alternating layers of dielectrics.) The neutral density filter is preferably provided as the first layer after the stop-etch coating on the glass substrate. A stop-etch layer must also separate the neutral density layer from the glass substrate and any dichroic layer. As with the deposition process, this embodiment also contemplates the use of a silica coating, and a red antihalation layer.

BRIEF DESCRIPTION OF THE DRAWINGS

The accompanying drawings illustrate the invention. In such drawings.

DETAILED DESCRIPTION OF THE PREFERRED EMBODIMENT

The present invention is embodied in permanent, full color transparencies on single glass substrates, and methods for making the same.

Figure 3:
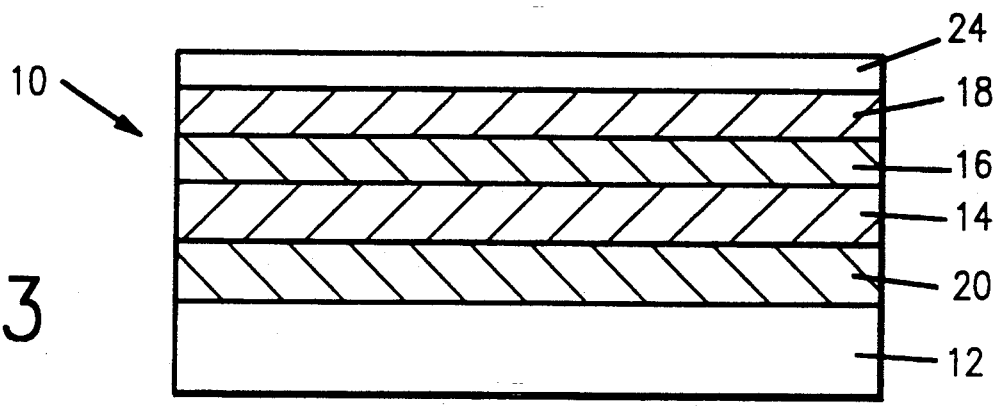
FIG. 3 is a cross-section illustration of the color transparency of the present invention prepared by the deposition process, showing generally the imaged dichroic filters and neutral density filter layered upon a single substrate.

As shown in FIG. 3, the color transparency 10 of the first embodiment of the present invention comprises a single glass substrate 12 having at least two, and preferably three, imaged dichroic filters (14, 16, 18) and an imaged neutral density filter 20. A dichroic filter is made from alternating layers of high and low refractive index dielectrics, such as metal oxides, to generate one of the primary subtractive colors, magenta, cyan, or yellow. A dichroic filter which transmits a primary subtractive color is also capable of reflecting a complimentary color. Specifically, a dichroic filter which transmits magenta is capable of reflecting green, one which transmits cyan is capable of reflecting red, and one which transmits yellow is capable of reflecting blue. It should be appreciated that the formation of a dichroic filter (also known as a dielectric filter or stack) to generate particular colors is well known in the art.

Figure 1:
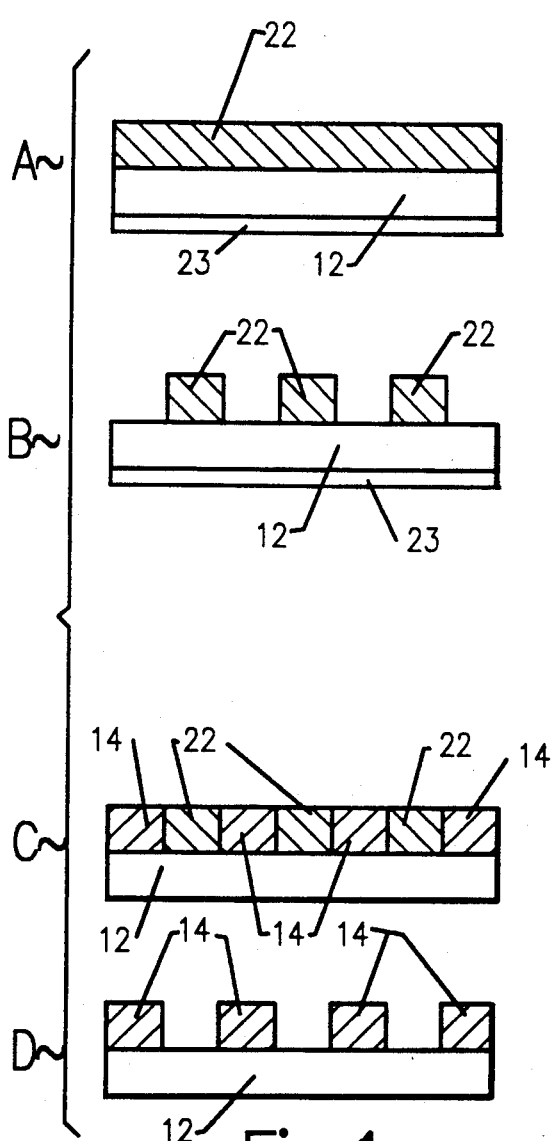
FIG. 1 is an illustration of preparing an imaged dichroic filter layer on a glass substrate by the deposition process.

The steps of the process for generating an imaged dichroic layer with respect to the first embodiment of the present invention are illustrated in FIG. 1. With particular reference to step A of FIG. 1, a heat-resistant, glass substrate 12 (or a previous filter if applicable) is coated with a primary photoresist 22 or photosensitive material, such as a formulation containing acrylic monomers commonly used in the photographic and electronics industries. The primary photoresist may be applied to the glass substrate as either a liquid or dry film. However, it is preferable in connection with the present invention to use a liquid, photoimageable, negative primary photoresist. If a liquid photoresist is used, it should be placed in an oven to dry it by driving out a portion of the solvent which it contains.

The photoresist 22 is then exposed by contacting it with a chrome on glass master, also known as a phototool, which possesses the image desired to be generated, and then subjecting it to ultraviolet light in an exposing chamber. The photoresist is exposed utilizing highly collimated radiation from a Xenon arc lamp. A highly collimated beam will strike the mask and penetrate the photoresist layer in straight lines. This is necessary for high resolution. The chrome on glass phototool should be placed in contact with the photoresist in a vacuum to provide for optimum contact. (It should be noted that a separate chrome on glass master or phototool must be made for each separate dichroic filter of the color transparency of the present invention.) The latent image is then developed. The glass substrate 12 is now masked by the photoresist with respect to the image that is generated (as illustrated by step B of FIG. 1).

The glass substrate 12 is then placed in a vacuum chamber where alternating layers of high and low refractive index dielectrics are vacuum deposited on the masked glass substrate to form a dichroic filter layer 14 of one of the primary subtractive colors (magenta, cyan, and yellow). See step C of FIG. 1. Other techniques, such as sputtering, may be used to deposit the dielectrics. Typically, it will be necessary to deposit 10-30 alternating layers of the high and low refractive index dielectrics on the masked glass substrate to form the dichroic filter. In accordance with the present invention, either silicon dioxide ($SiO_2$, n=index of refraction=1.53), magnesium fluoride ($MgF_2$, n=1.38), or cyrolite ($Na_3AlF_6$, n=1.35) may be utilized as the low refractive index layer, and either titanium dioxide ($TiO_2$, n=2.55), zinc sulfide (ZnS, n=2.2), or zirconium oxide ($ZrO_2$, n=2.0) as the high refractive index layer. It should be appreciated by those of ordinary skill in the art that the refractive index and thickness of the top and bottom layers of the dielectric stack should be carefully chosen so that they are compatible with the color separation of the next dichroic filter layer to be prepared.

Once the alternating layers of dielectrics have been deposited on the masked substrate, the photoresist 22 is then stripped using an appropriate organic solvent (such as glycol ethers or xylene) depending on the particular photoresist used. After the photoresist is stripped, only the imaged dichroic filter layer 14 will remain on the glass substrate 12 (or previous filter if applicable). See step D of FIG. 1.

A second imaged dichroic filter 16 (as shown in FIG. 3) is then generated upon the first imaged dichroic filter 14, in the same manner as described above and as graphically illustrated in steps A-D of FIG. 1. The second imaged dichroic filter is typically generated so that it is of a primary subtractive color other than that of the first dichroic filter. However, it should be understood that the color of the dichroic filter may be chosen depending on the overall color scheme and image desired to be created on the color transparency. Further, in accordance with the present invention, a third imaged dichroic filter 18 (as shown in FIG. 3) may be generated upon the second dichroic filter 16, also in the same manner as described above for the first and second dichroic filters. The third dichroic filter typically will be of a primary subtractive color other than that of the first or second dichroic filters.

In addition, a high resolution neutral density filter 20 (as shown in FIG. 3) is required for the color transparency of the present invention. The neutral density filter 30 is generated by the previously described process with the exception that only a single layer of metal is deposited over the masked substrate rather than alternating layers of dielectrics. Chrome is preferably the metal used to form the neutral density filter as the first layer immediately next to the glass substrate 12, since the neutral density filter may be of higher resolution than the dichroic filters (14, 16, 18). However, the neutral density filter may be positioned between any of the imaged dichroic filters or on top of the dichroic filters to form the color transparency of the present invention.

In another feature to the present invention, after the photoresist 22 has been added and dried (Step A, FIG. 1), a red antihalation coating 23 is applied to the opposite or lower surface of the glass substrate 12 and is permitted to air dry. The red antihalation coating prevents second surface reflection from the lower surface of the glass substrate. Without the red antihalation coating, some of the ultraviolet radiation might be reflected from the second surface exposing additional portions of the photoresist. This may result in a ghost image giving the effect of poor resolution. The red antihalation layer is removed by the use of scotch tape before the latent image on the photoresist is developed. The red antihalation coating should be applied after every layer of photoresist, since the dichroic layers may be transparent to ultraviolet radiation.

Finally, in accordance with the first embodiment of the present invention, a silica coating 24 (FIG. 3) may be vacuum deposited on top of the outer filter to make the completed transparency abrasion resistant.

The present invention is also embodied in a color transparency on a single glass substrate prepared by an etching process rather than the deposition process as described above. The permanent, full color transparency 25 prepared by the etching process (FIG. 4) is very similar to the transparency 10 generated by the deposition process (FIG. 3), with the primary exception that a stop-etch layer 26 is provided to separate each layer of the transparency, as will be described below. As mentioned above in connection with the deposition process, it is preferred to apply the neutral density filter as the first layer on the glass substrate (but after a stop-etch layer 26 is applied in accordance with this embodiment.)

Figure 2:
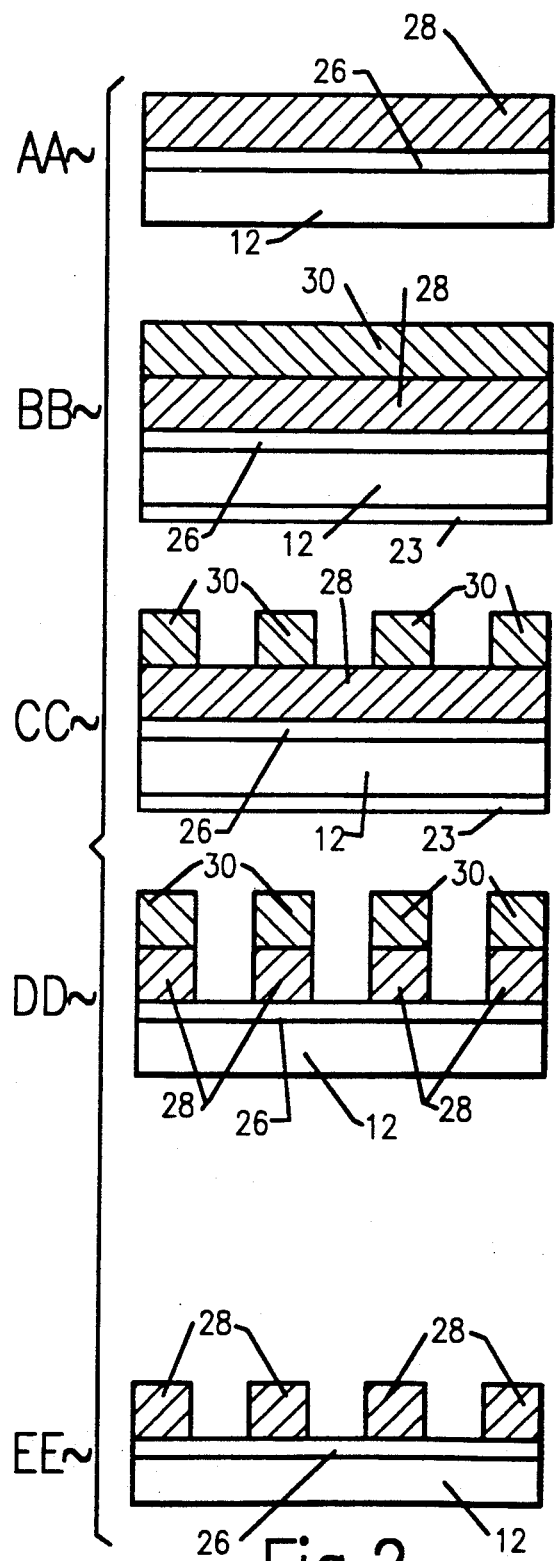
FIG. 2 is an illustration of preparing an imaged dichroic filter on a glass substrate by the etching process.

The sequence of the etching process of the alternative embodiment of the present invention is generally illustrated in FIG. 2 of the drawings. As shown in step AA of FIG. 2, a heat-resistant glass substrate 12 (or previous filter if applicable) is coated with stop-etch layer 26 to protect the glass substrate during the etching process (as discussed below.) The stop-etch material may be vapor deposited on the glass substrate in a vacuum, or may be applied by another technique such as sputtering. In accordance with the present invention, it has been found that a 1600 nm thick coating of thorium fluoride may be utilized as the stop-etch layer when dilute hydrofluoric acid (HF) is used as the etching solution.

As further illustrated in step AA of FIG. 2, a first dichroic filter 28 is then deposited upon the stop-etch layer 26. As with the deposition process, the dichroic filter is created by depositing alternating layers (typically 10 to 30) of high and low refractive index dielectrics (respectively $TiO_2$ and $SiO_2$, for example) upon the stop-etch coated surface. The dielectric layers may be vapor deposited in a vacuum, or can be applied by another technique such as sputtering.

Once the dichroic filter layer 28 has been generated, a photoresist layer 30 is applied upon the dichroic filter (as shown in step BB of FIG. 2). The application of the photoresist layer 30 of the etching process is prepared in accordance with the preparation of the photoresist layer 22 of the deposition process discussed above. Similarly, the photoresist layer 30 is exposed or on-contact imaged by the use of a chrome on glass master, or phototool, and then developed (step CC, FIG. 2), as explained above in connection with the deposition process. The dichroic filter layer 28 is now masked by the imaged photoresist layer.

After the image has been developed, a dilute solution of hydrofluoric acid (HF), or other suitable etching material, is applied to the masked substrate to etch out the corresponding imaged portion of the dichroic filter 28 down to the stop-etch layer 26 immediately on the glass substrate 12 (see step DD of FIG. 2.) Alternatively, other known etching processes, such as, for example, reactive plasma etching and ion beam etching may be used. As mentioned above, the stop-etch layer 26 will protect the substrate from the etching solution Without the stop-etch layer, the etching solution will "frost" or distort the glass substrate resulting in defocusing and low image resolution or quality. The stop-etch layer also prevents non-uniform coloring of the dichroic filter, particularly with a magenta filter. The next step in the sequence is to strip the photoresist layer 30 from the imaged dichroic filter layer 28 with an appropriate organic solvent. See step EE of FIG. 2.

Figure 4:
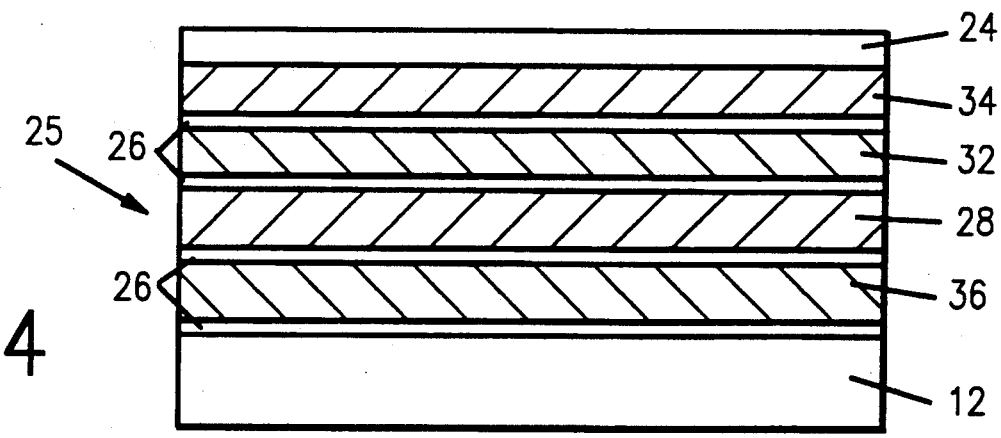
FIG. 4 is a cross-section illustration of an alternative color transparency of the present invention prepared by the etching process, showing generally the imaged dichroic filters and neutral density filter separated from each other by stop-etch layers and layered upon a single substrate.

A second imaged dichroic filter layer 32 is then created on the first imaged dichroic filter layer 28 in the same manner. However, in accordance with the present invention, it is important to provide a stop-etch layer 26 on the first imaged dichroic layer before creating the second dichroic layer, for the reasons stated above. Similarly, a stop-etch layer 26 must be provided on top of the second dichroic filter if a third dichroic filter 34 is generated (FIG. 4). As with the deposition process, the colors and order of the dichroic filters may be arranged in accordance with the overall desired image color of the transparency.

A neutral density filter 36 is prepared by the same etching process as explained above, with the general exception that a single layer of a metal, such as chrome, silver or nickel, is used to form this filter rather than alternating layers of dielectrics. Also, hydrochloric acid (HCl) is used as a preferred etching solution in preparing the neutral density filter, rather than HF. Preferably, the neutral density filter is placed adjacent to the stop-etch layer 26 next to the glass substrate 12 and before the dichroic layers (28, 32, 34), since the neutral density filter may be of higher resolution than the dichroic filters Nonetheless, it is important that a stop-etch layer 26 be provided between the neutral density filter and the glass substrate, or between the neutral density filter and any other dichroic layer of the color transparency 25 in order to achieve the objectives of the present invention.

In another aspect of this embodiment of the present invention, the creation of an imaged photoresist and its subsequent etching should be carried out two to three times per dichroic filter color to improve image quality by preventing undercutting and loss of structural detail.

In a further aspect of the invention, a silica coating 24 (FIG. 4) may also be applied on the outer filter to make the color transparency abrasion resistant.

In yet a further aspect of the present invention, a red antihalation coating 23 is applied on the lower surface of the glass substrate (opposite the surface with the filters) before each photoresist layer is exposed to prevent undesirable additional exposure of the photoresist layers, as discussed above. The red antihalation coating is removed with scotch tape before the image is developed.

While a particular form of the invention has been illustrated and described, it will be appreciated that various modifications can be made without departing from the spirit and scope of the invention. Therefore, it is not intended that the invention be limited, except as appended by the claims.

We claim:

1. A process for preparing a color transparency having a single substrate comprising:
   coating a glass substrate on one surface with a photoresist;
   developing an image on the photoresist;
   depositing alternating layers of high and low refractive index dielectrics on the imaged photoresist to create a dichroic filter of a desired color;
   stripping the photoresist from the glass substrate whereby a first imaged dichroic filter layer is produced;
   preparing at least one additional imaged dichroic filter layer in the same manner as the first; and
   preparing an imaged neutral density filter on the side of the substrate having the dichroic filters, the neutral density filter being prepared in the same manner as for the imaged dichroic filters with the exception that only a single layer of metal is deposited on the imaged photoresist rather than alternating layers of high and low refractive index dielectrics.

2. The process for preparing a color transparency having a single substrate as in claim 1, wherein the neutral density filter is positioned as the first layer adjacent to the glass substrate.

3. The process for preparing a color transparency having a single substrate as in claim 1, wherein the image is developed on the photoresist after exposing the photoresist by contacting it with a chrome on glass phototool and subjecting it to ultraviolet light in an exposing chamber.

4. The process for preparing a color transparency having a single substrate as in claim 1, further comprising the step of depositing an abrasion-resistant silica coating on top of the outer filter layer.

5. The process for preparing a color transparency having a single substrate as in claim 1, further comprising the step of coating the glass substrate on the surface opposite the photoresist with a red antihalation layer before any image is exposed on the photoresist.

6. A color transparency having a single substrate comprising:
   an imaged neutral density filter deposited on one surface of a glass substrate;
   an imaged first dichroic filter deposited on the neutral density filter; and,
   at least one additional imaged dichroic filter deposited on the first dichroic filter.

7. The color transparency having a single substrate of claim 6, further comprising:
   a second imaged dichroic filter deposited on the first dichroic filter; and
   a third imaged dichroic filter deposited on the second dichroic filter.

8. The color transparency having a single substrate of claim 7, wherein the first dichroic filter is green reflecting or magenta transmitting, the second dichroic filter is blue reflecting or yellow transmitting, and the third filter is red reflecting or cyan transmitting.

9. A process for preparing a color transparency having a single substrate comprising:
   coating a glass substrate on one surface with a stop-etch layer;
   preparing a first dichroic filter on the stop-etch layer by depositing alternating layers of high and low refractive index dielectrics thereupon;
   depositing a photoresist on the first dichroic filter;
   developing an image on the photoresist to mask the first dichroic filter;
   stripping the photoresist whereby an imaged dichroic filter is produced;
   preparing at least one additional imaged dichroic filter in the same manner as the first, including coating the previous filter layer with a stop-etch; and
   preparing an imaged neutral density filter on the side of the substrate having the dichroic filters, the neutral density filter being prepared in the same manner as for the imaged dichroic filters, including a stop-etch layer between the neutral density filter and any other layer, except that only a single layer of metal is used to create the neutral density filter rather than alternating layers of high and low refractive index dielectrics.

10. The process for preparing a color transparency having a single substrate as in claim 9, wherein the neutral density filter is positioned as the first layer adjacent to the stop-etch layer coating the glass substrate.

11. The process for preparing a color transparency having a single substrate as in claim 9, further comprising the step of depositing an abrasion-resistant silica coating on top of the outer filter layer.

12. The process for preparing a color transparency having a single substrate as in claim 9, wherein the steps of creating an imaged photoresist and its subsequent etching should be repeated at least twice for every imaged dichroic filter prepared in order to improve image quality.

13. The process for preparing a color transparency having a single substrate as in claim 9, further comprising the step of coating the glass substrate on the surface opposite the photoresist with a red antihalation layer before any image is exposed on the photoresist.

14. A color transparency having a single substrate comprising:
   a stop-etch coating deposited on one surface of a glass substrate;
   a imaged neutral density filter deposited on the stop-etch layer;
   a second stop-etch layer deposited on the neutral density filter;
   a first imaged dichroic filter deposited on the second stop-etch layer; and
   at least one additional imaged dichroic filter deposited on the first imaged dichroic layer, with the requirement that a stop-etch layer separate any added dichroic filter from the previous dichroic filter.

15. The color transparency having a single substrate of claim 14, further comprising:
   a second imaged dichroic filter deposited on the second stop-etch layer;
   a third stop-etch layer deposited on the second imaged dichroic filter; and
   a third imaged dichroic filter deposited on the third stop-etch layer.

16. The color transparency having a single substrate of claim 15, wherein the first dichroic filter is green reflecting or magenta transmitting, the second dichroic filter is blue reflecting or yellow transmitting, and the third filter is red reflecting or cyan transmitting.

* * * * *